United States Patent
Dan et al.

(10) Patent No.: US 11,150,700 B2
(45) Date of Patent: Oct. 19, 2021

(54) RADIO FREQUENCY FILTER FIN PACK DESIGN IN CONSUMER ELECTRONICS

(71) Applicant: Microsoft Technology Licensing, LLC, Redmond, WA (US)

(72) Inventors: Bo Dan, Redmond, WA (US); Robert Ullman Myers, Kirkland, WA (US); Aaron Ray Paff, Duvall, WA (US); Raghavendra S Kanivihalli, Bellevue, WA (US); Eugene Lee, Kenmore, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/179,654

(22) Filed: Nov. 2, 2018

(65) Prior Publication Data

US 2020/0142450 A1    May 7, 2020

(51) Int. Cl.
*G06F 1/16* (2006.01)
*G06F 30/00* (2020.01)
(Continued)

(52) U.S. Cl.
CPC .......... *G06F 1/1656* (2013.01); *G06F 1/1698* (2013.01); *G06F 1/203* (2013.01); *G06F 30/00* (2020.01); *G06F 2200/201* (2013.01); *H05K 7/20336* (2013.01); *H05K 7/20409* (2013.01); *H05K 9/0007* (2013.01)

(58) Field of Classification Search
CPC . H01L 23/427; H01L 23/3672; H01L 23/552; H02J 50/70; H01Q 1/526; G06F 1/203; G06F 1/20; G06F 1/206; G06F 1/1656; G06F 1/182; G06F 1/1616; G06F 30/00; G06F 1/1698; G06F 2200/201; H05K 7/20; H05K 7/20409; H05K 1/0203; H05K 7/20127; H05K 7/20336;
(Continued)

(56) References Cited

U.S. PATENT DOCUMENTS 5,030,793 A * 7/1991 McCarthy .......... H05K 7/20409
174/383
5,392,461 A * 2/1995 Yokoyama ............. H01Q 1/245
361/800
(Continued)

FOREIGN PATENT DOCUMENTS

WO    2015039920 A1    3/2015

OTHER PUBLICATIONS

"International Search Report and Written Opinion Issued in PCT Application No. PCT/US2019/058415", dated Feb. 13, 2020, 14 Pages.

*Primary Examiner* — Mandeep S Buttar
(74) *Attorney, Agent, or Firm* — Ray Quinney & Nebeker P.C.; Paul N. Taylor

(57) ABSTRACT

A thermal management device with electromagnetic (EM) shielding includes a fin pack with a plurality of channels. The fin pack has an upper and lower surface. The fin pack has a pack length, pack height, and pack width. The fin pack has fins are oriented connecting the upper surface to the lower surface. The plurality of channels extends from a first end toward a second end. A first channel of the plurality of channels is adjacent the upper surface, and a second channel of the plurality of channels is adjacent the lower surface.

20 Claims, 4 Drawing Sheets

(51) Int. Cl.
*G06F 1/20* (2006.01)
*H05K 7/20* (2006.01)
*H05K 9/00* (2006.01)

(58) Field of Classification Search
CPC ....... H05K 7/2039; H05K 2201/10371; H05K 7/20154; H05K 9/0007
USPC ..... 361/710, 679.47, 704, 709, 679.54, 703, 361/711, 818; 165/104.33; 257/E23.114
See application file for complete search history.

(56) References Cited

U.S. PATENT DOCUMENTS

| | | | |
|---|---|---|---|
| 6,552,261 B2 * | 4/2003 | Shlahtichman | H05K 9/0032 174/363 |
| 6,577,504 B1 | 6/2003 | Lofland et al. | |
| 6,717,799 B2 | 4/2004 | Hamano et al. | |
| 9,538,693 B2 | 1/2017 | Kurz et al. | |
| 9,859,186 B2 | 1/2018 | Nuttall | |
| 2006/0126309 A1 * | 6/2006 | Bolle | H05K 9/0033 361/719 |
| 2007/0035929 A1 * | 2/2007 | Hsu | H01L 23/3675 361/704 |
| 2008/0225492 A1 | 9/2008 | Murasawa et al. | |
| 2010/0091442 A1 * | 4/2010 | Theobald | G06F 1/1679 361/679.09 |
| 2013/0145612 A1 | 6/2013 | Busch et al. | |
| 2014/0168893 A1 | 6/2014 | Niu et al. | |
| 2014/0321046 A1 * | 10/2014 | Sinha | G06F 1/182 361/679.33 |
| 2016/0227673 A1 | 8/2016 | Ramones et al. | |
| 2017/0235349 A1 * | 8/2017 | Ghioni | H01L 23/427 361/679.47 |
| 2018/0006354 A1 | 1/2018 | Nivet et al. | |
| 2018/0320878 A1 * | 11/2018 | Duong | F21V 29/745 |

* cited by examiner

RADIO FREQUENCY FILTER FIN PACK DESIGN IN CONSUMER ELECTRONICS

CROSS-REFERENCE TO RELATED APPLICATIONS

N/A

BACKGROUND OF THE DISCLOSURE

Modern computing devices are becoming more powerful and more compact. Space within the volume of the housing or case of the computing device is required by more components and more powerful components. More powerful components commonly consume more electrical energy and generate more heat during use. Similarly, more powerful components also require higher data rates which generate a greater amount of electromagnetic (EM) radiation.

Compact and portable computing devices rely upon wireless communications to access websites, remote servers, and other internet-enabled features. The antenna in the computing devices that includes wireless communications is particularly susceptible to EM interference from the other components of the computing device. Conventionally, the solution to both the EM interference and the thermal energy generated by increasingly powerful components was to use larger cases or housings to move components further apart, provide airflow, and shield the antenna from EM interference. Users of modern portable devices show a strong preference for lightweight and thin devices. A smaller, more efficient thermal management and EM attenuation device is needed.

SUMMARY

In some implementations, a computing device includes an antenna, a heat source, and a fin pack. The fin pack is in thermal communication with the heat source to dissipate heat from the heat source. The fin pack is adjacent the antenna without any added electromagnetic shielding between the fin pack and the antenna.

In some implementations, a thermal management device with electromagnetic (EM) shielding includes a fin pack with a plurality of channels. The fin pack has an upper and lower surface. The fin pack has a pack length, pack height, and pack width. The fin pack has fins are oriented connecting the upper surface to the lower surface. The plurality of channels extends from a first end toward a second end. A first channel of the plurality of channels is adjacent the upper surface, and a second channel of the plurality of channels is adjacent the lower surface.

In some implementations, a method of designing a thermal management device with EM shielding includes determining an EM shielding requirement; determining a thermal management requirement, and designing a fin pack to satisfy both the EM shielding requirement and the thermal management requirement.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of implementations of the disclosure will be set forth in the description which follows, and in part will be obvious from the description, or may be learned by the practice of such implementations. The features and advantages of such implementations may be realized and obtained by means of the instruments and combinations particularly pointed out in the appended claims. These and other features will become more fully apparent from the following description and appended claims or may be learned by the practice of such implementations as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which.

DETAILED DESCRIPTION

This disclosure generally relates to devices, systems, and methods for providing an integrated thermal management device and electromagnetic (EM) shielding device. More particularly, this disclosure relates to providing a fin pack for dissipating heat generated by electronic components of a computing device. The fin pack according to the present disclosure also attenuates EM radiation that is generated by the electronic components of the computing device in an attenuation range. The attenuation range is selected based upon an antenna of the computing device. For example, the electronic components of the computing device create both heat and EM radiation during usage. The heat can be dissipated from the electronic components by a cooling system including a fin pack that provides more surface area to exchange heat with airflow. The fin pack can be sized and arranged to function as an EM attenuator similar to a Faraday cage or other radio frequency (RF) buffer to attenuate EM radiation that would otherwise interfere with the performance of the antenna as well as performing its purpose for dissipating heat.

It may be desirable to produce a computing device that is as thin and as light as possible. In some implementations, an integrated fin pack according to the present disclosure saves space and weight by combining two components with disparate purposes into a single component. As will be shown, testing has demonstrated that an integrated fin pack can provide both improved thermal management performance and improved EM attenuation performance when compared to a conventional two-component configuration.

Figure 1:
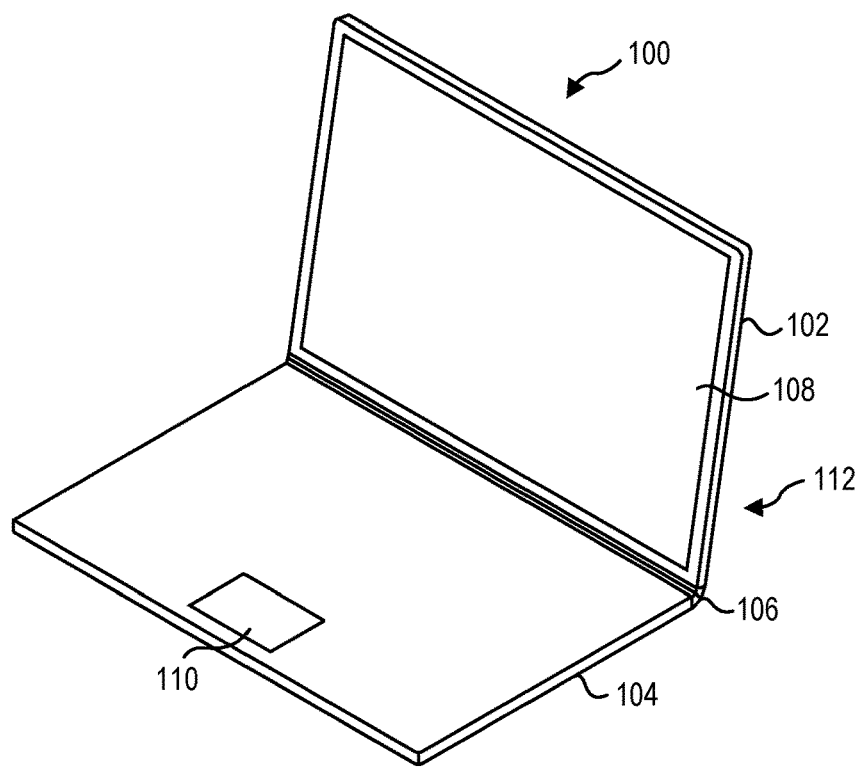
FIG. 1 is a perspective view of a computing device with an input device, according to at least one implementation of the present disclosure.

FIG. 1 is a perspective view of an implementation of a computing device 100. The computing device 100 may include a first portion 102 and a second portion 104 movably connected to one another by a hinge 106. In some implementations, the first portion 102 of the computing device 100 may include a display 108 to present visual information to a user and the second portion 104 of the computing device 100 may include one or more input devices 110, such as a trackpad, a keyboard, etc., to allow a user to interact with the computing device 100. In implementations in which the computing device is a hybrid computer, the first portion 102 may include the display 108 and at least a processor 112. The first portion 102 may further include additional computer components, such as a storage device, system memory, a graphical processing unit, graphics memory, one or more communication devices (such as WIFI, BLUETOOTH, near-field communications), peripheral connection points, etc. In some implementations, the first portion 102 may be removable from the hinge 106 and/or the second portion 104.

Figure 2:
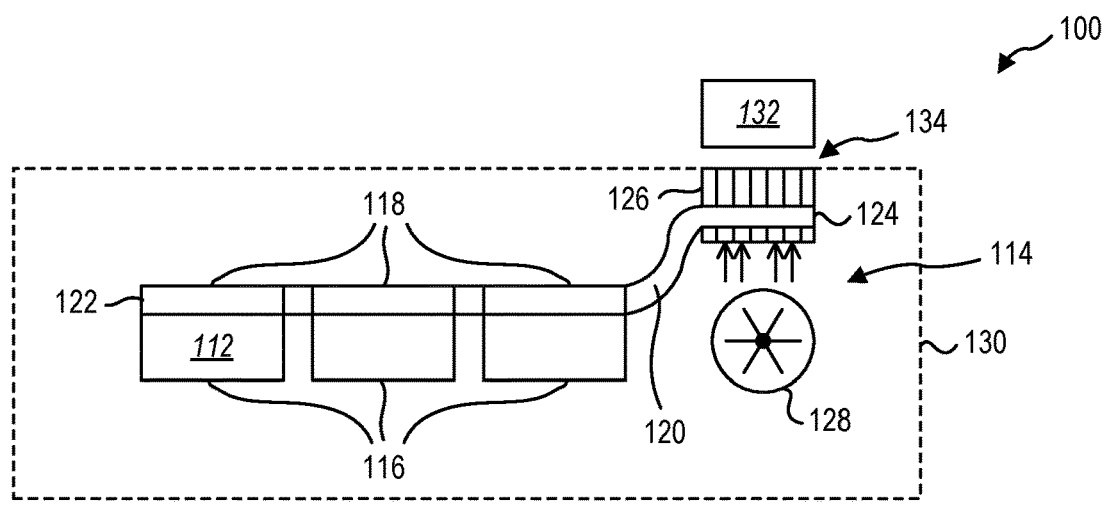
FIG. 2 is a schematic view of a cooling system of the computing device of FIG. 1, according to at least one implementation of the present disclosure.

FIG. 2 is a detail view of cooling system 114 of the computing device 100 described in relation to FIG. 1. The computing device 100 includes a variety of components that generate heat. The heat sources 116 can be any component of the computing device that generates heat but, particularly, may include a processor 112 (such as a central processing unit (CPU), a graphical processing unit (GPU), a physics processing unit, or other processors), system memory, video memory, storage devices, networking devices, display devices, input devices, optical drives, peripheral connection ports, or any other components of the computing device 100.

In some implementations, the heat from the heat sources 116 is distributed from a heat source 116 across a surface by a heat spreader 118. In other implementations, the heat is conducted from the heat sources 116 toward a cooler region of the computing device 100 and/or toward an exhaust by a heat transfer element 120. In yet other implementations, the heat is conducted from a heat source 116 through a coldplate 118 to a heat transfer element 120.

The heat transfer element 120 may be a thermally conductive material, such as copper, silver, or aluminum that conducts heat from a region of higher thermal energy to a region of lower thermal energy. For example, the heat transfer element 120 will conduct thermal energy from the first end 122 of the heat transfer element 120 adjacent the heat sources 116 toward a cooler second end 124 of the heat transfer element 120 near a heat sink to lessen a temperature gradient along the heat transfer element 120. In other examples, the heat transfer element 120 may be a heat pipe that may further aid in transferring thermal energy away from the heat sources 116.

At the higher temperature ("hot") interface of a heat pipe a liquid in contact with a thermally conductive solid surface turns into a vapor by absorbing heat from that surface. The vapor then travels along the heat pipe to a lower temperature ("cold") interface and condenses back into a liquid releasing the latent heat. The liquid then returns to the hot interface through, for example, capillary action, centrifugal force, or gravity, and the cycle repeats. Due to the high heat transfer coefficients for boiling and condensation, vapor cooling system heat pipes are effective thermal conductors. The effective thermal conductivity varies with heat pipe length, and can approach 100 kW/(m·K) for long heat pipes, in comparison with approximately 400 W/(m·K) for copper.

In some implementations, the second end 124 of heat transfer element 120 is in contact with, in proximity to, or attached to a heat sink, such as a fin pack 126. The fin pack 126 includes or is made of a thermally conductive material to conduct thermal energy from the second end 124 of the heat transfer element 120 into the fin pack 126. The fin pack 126 has a plurality of fins, channels, rails, or other structures that increase the surface area of the fin pack 126 to dissipate the thermal energy In some implementations, the thermally conductive material has a thermal conductivity in a range having an upper value, a lower value, or upper and lower values including any of 100 Watts per meter-Kelvin (W/m·K), 125 W/m·K, 150 W/m·K, 175 W/m·K, 200 W/m·K, 250 W/m·K, 300 W/m·K, 400 W/m·K, 450 W/m·K, or any values therebetween. For example, the thermal conductivity may be greater than 100 W/m·K. In other examples, the thermal conductivity may be less than 450 W/m·K. In yet other examples, the thermal conductivity may be between 100 W/m·K and 450 W/m·K. In further examples, the thermal conductivity may be greater than 150 W/m·K. In at least one example, the thermal conductivity may be greater than 250 W/m·K.

In some implementations, a cooling system 114 is a passive system that draws thermal energy from the heat sources 116 to the fin pack 126 and the fin pack 126 dissipates the thermal energy through natural convection. In other implementations, the cooling system 114 is an active cooling system that thermal energy from the heat sources 116 to the fin pack 126, and the fin pack 126 dissipates the thermal energy through air flowed through or over the fin pack 126 by a fan 128. The fan 128 may move air flow through one or more channels of the fin pack 126 such that air absorbs thermal energy from the surfaces of the fin pack 126. The dissipation of heat from the fin pack 126 reduces the temperature of the fin pack 126 to allow the heat transfer element 120 to transfer more heat from the heat sources 116 to the fin pack 126.

In a conventional computing device 100, an EM shield 130 may be positioned around or over at least a portion of the electronic components. For example, the processor 112 or other electronic components of the computing device 100 generate EM radiation during operation. The EM radiation emitted by the processor 112 or other electronic components can interfere with the operation of an antenna 132. The EM shield 130 of the computing device 100 can attenuate the EM radiation emitted by the processor 112 or other electronic components in the range of frequencies to which the antenna is intended to receive.

The EM shield 130 defines a shielded side (external to the EM shield 130) and an unshielded side (internal to the EM shield 130) on which the EM radiation sources are located. The EM shield may be a Faraday cage-style EM shield 130 that includes a conductive material to suppress the EM radiation from the processor 112 or other electronic components internally. The internal conduction of the EM radiation along the Faraday cage shields the EM radiation that may interfere with the operation of the antenna 132.

However, a conventional Faraday cage-style EM shield 130 is inefficient at transferring thermal energy through the EM shield 130 and may cause the heat sources 116 to increase in temperature by limiting ventilation through the EM shield 130. An aperture 134 is provided in the EM shield 130 to allow air flow through the aperture to exhaust the thermal energy (via warm air) from the heat sources 116 and the computing device 100. In some implementations, the aperture 134 may have an area that is dependent on particular design requirements such as thermal or RF requirements.

The aperture 134, while allowing more efficient air flow to exhaust from the heat sources 116 within the EM shield 130, can allow EM radiation leakage out of the EM shield 130. In implementations with the antenna in proximity to the aperture 134, the EM radiation leakage can interfere with the signal to be received by the antenna 132. Conventional computing devices 100 can include a radio frequency (RF) buffer positioned near or adjacent to the fin pack 126 and/or aperture 134 to limit the EM radiation leakage from the aperture through the fin pack 126. However, the RF buffer reduces air flow through the aperture 134, decreasing the thermal management efficiency and capacity of the cooling system 114.

A fin pack 126 according to the present disclosure has a plurality of channels defined by fins and rails. The fin pack 126 is in thermal communication with the heat sources 116 through a heat transfer element 120 or other mechanism to transfer thermal energy from the heat sources 116. The channels allow air flow from the fan 128 through the fin pack 126 while the dimensions of the channels, rails, and fins are selected based on the frequency of the EM radiation to be attenuated. The fin pack 126, therefore, attenuates the EM radiation produced by the processor 112 or other electronic components. In some implementations, the fin pack 126 may be in electrical contact with the EM shield 130.

Figure 3:
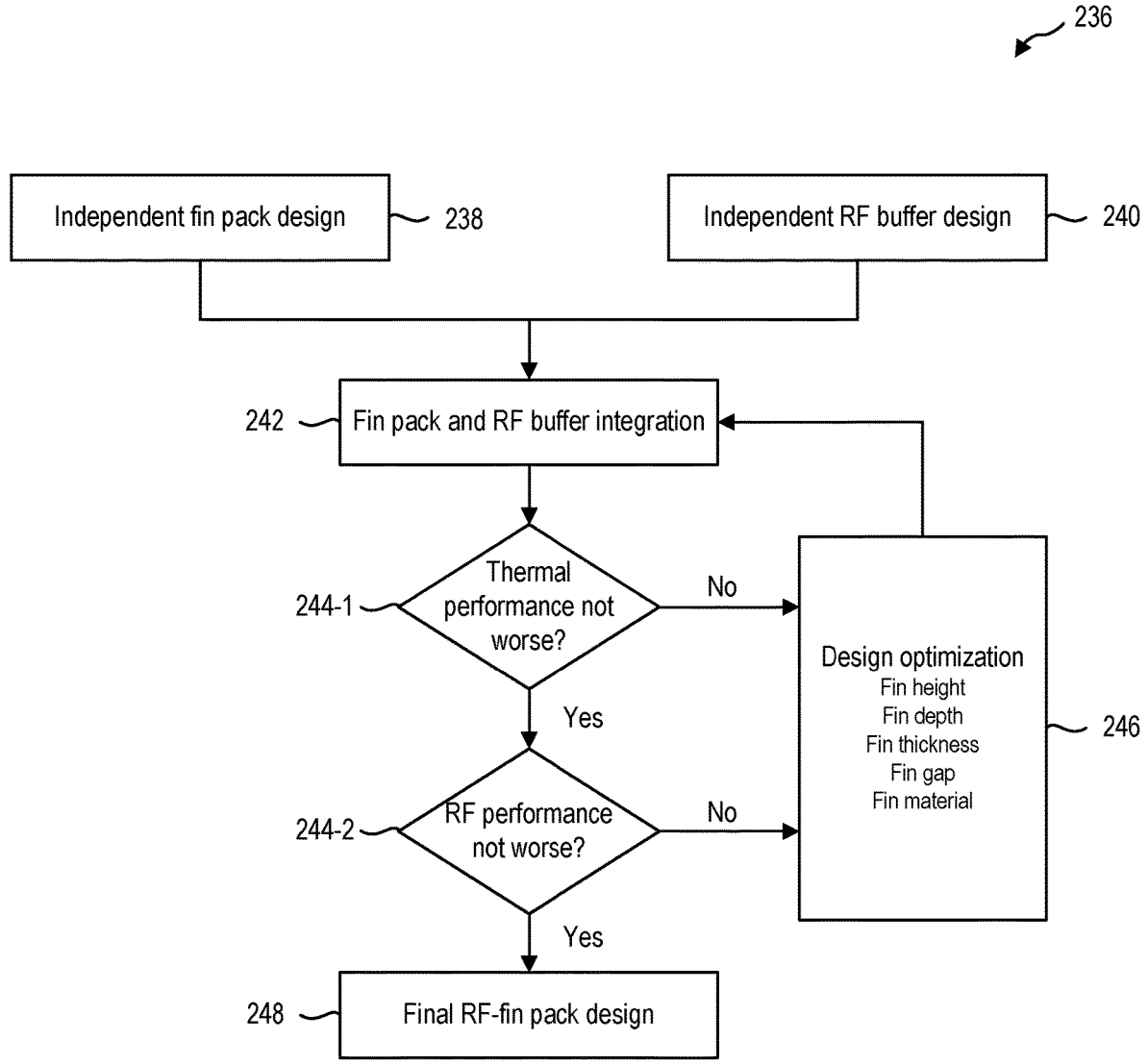
FIG. 3 is a flowchart illustrating a method of designing an integrated electromagnetic (EM) shielding fin pack, according to at least one implementation of the present disclosure.

FIG. 3 is a flowchart illustrating a method 236 of designing an EM attenuating thermal management device, such as the fin pack described in relation to FIG. 2. The method 236 includes integrating an independent fin pack design 238 known to exhibit the desired thermal properties and an independent RF buffer design 240 known to exhibit the desired EM shielding properties at 242. The integration includes forming a fin pack and RF buffer in a single, integral piece. For example, a fin pack may be machined or cast from a single continuous piece of thermally conductive and electrically conductive material having a channel size that is based at least partially on the pore size or mesh size of the independent RF buffer.

The method 236 includes performing a simulation, such as a finite element analysis, a thermal simulation, prototyping, or combinations thereof to verify that the integrated design does not degrade the thermal performance at 244-1 below the independent fin pack design 238 and to verify the integrated design does not degrade the RF performance at 244-2 below the independent RF buffer design 240. If the integrated design fails either of the thermal performance verification at 244-1 or the RF performance verification at 244-2, the integrated design is optimized at 246. The optimization may include changing the fin height, fin depth, fin thickness, fin gap, fin material, or combinations thereof.

For example, the EM shielding of a Faraday-cage style buffer is based upon the wavelength and the required attenuation at that wavelength. For example, the higher the frequency, the shorter the wavelength of the EM radiation. The shorter the wavelength, the smaller the pores or channel openings need to be to attenuate the EM radiation.

A Faraday cage operates by balancing the electrical fields on either side of the cage. A substantially continuous Faraday shield allows the free conduction of electrical charge through the walls of the Faraday shield and becomes a hollow conductor. Introducing an aperture into the Faraday shield allows the leakage of EM radiation through the aperture. For the Faraday cage to function as such, the aperture size must be many times smaller than the wavelength of the interest. By positioning the conductive fin pack in the aperture, the fin pack divides the aperture into a collection of smaller openings based on the channel size of the fin pack. However, as the fin pack channels are elongated, the fin pack offers additional attenuation for EM radiation wavelengths smaller than the channel size, as the EM radiation must pass through the length of the channels to leak from the fin pack. For example, attenuation may be controlled by the grounding of the fin pack, distance and/or position of the antenna relative to the Faraday cage, fin pack configuration, fin pitch, frequency, other factors, or combinations thereof.

In some implementations, the fin pitch may be the most important factor. For example, in designing the fin pack, the fin pitch may be weighted higher than other design variables. In further implementations, the fin height may be the most important factor. For example, the fin height may be weighted higher than other design variables. In even further implementations, the fin pitch may be weighted higher than the fin height which may be weighted higher than other design variables.

While reducing the channel cross-sectional area can increase the attenuation of the EM radiation, the reduced channel cross-sectional area will also reduce the airflow through the channel, adversely affecting the thermal management performance. The method 236 includes iterating through variations of the fin pack design to produce a final combination RF-fin pack design at 248 that satisfies the thermal performance verification 244-1 and RF performance verification at 244-2.

Figure 4:
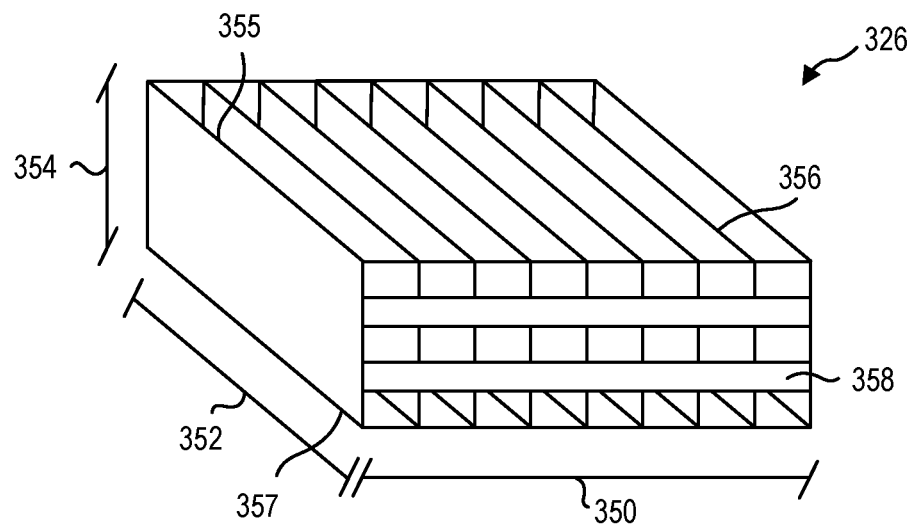
FIG. 4 is a perspective view of an integrated EM shielding fin pack, according to at least one implementation of the present disclosure.

FIG. 4 is a perspective view of an implementation of an EM shielding fin pack 326. The fin pack 326 has a pack width 350, pack length 352, and a pack height 354. The pack width 350 and pack height 354 are sized such that a cross-sectional area of the fin pack fits the aperture into which the fin pack 326 may be positioned. The fin pack length 352 may vary to alter the thermal management properties (e.g., altering the total surface area of the fin pack 326), and/or to alter the EM attenuation properties (e.g., altering the channel length to increase attenuation). The fin pack 326 includes a plurality of fins 356 oriented between an upper surface 355 and a lower surface 357 of the fin pack 326. The fins 356 radiate and/or conduct thermal energy. The fins 356 are electrically conductive to provide EM attenuation when arranged with rails 358 that are electrically conductive, also, and provide electrical continuity between the fins 356.

In some implementations, the rails 358 are positioned at one end of the fins 356 to provide electrical continuity and EM shielding at the end of the fin pack 326. For example, the rails 358 may be positioned at the end of the fin pack 326 configured to be positioned in the aperture of the computing device. In other implementations, the rails 358 may be continuous sheets that form junctions with the fins 356 along a portion or all of the pack length 352. For example, the rails 358 and fins 356 may contact one another through at least 25% of the pack length, 50% of the pack length 352, 75% of the pack length, or 100% of the pack length. In such implementations, the rails 348 and fins 356 form channels oriented from a first end of the fin pack 326 to a second end of the fin pack 326 parallel to the upper surface 355 and lower surface 357. The channels provide fluid communication therethrough to direct airflow through the fin pack 326.

Longer rails 358 may increase the surface area available for thermal radiation and/or conductivity. Longer rails 358 may also increase the EM attenuation of the EM radiation produced by the electronic components. However, shorter rails 358 may increase airflow through the fin pack 326, increasing overall thermal management capacity of the fin pack 326.

Figure 5:
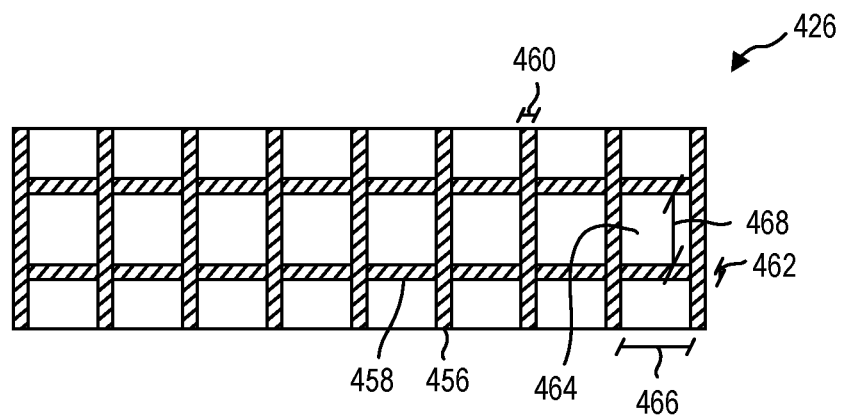
FIG. 5 is a cross-sectional view of another integrated EM shielding fin pack, according to at least one implementation of the present disclosure.

FIG. 5 is a cross-sectional view of another implementation of an EM shielding fin pack 426. In the illustrated implementation, the rails 458 are continuous through the pack length of the fin pack 426. The fin pack 426 includes a plurality of fins 456 and a plurality of rails 458 that are in electric communication with one another. The fins 456 have a fin thickness 460, and the rails 458 have a rail thickness 462. Increasing the fin thickness 460 and/or the rail thickness 462 may reduce the air flow through the channels 464 defined by the fins 456 and rails 458 while increasing the electrical conductivity of the fins 456 and rails 458.

The channels 464 between the fins 456 and rails 458 have a channel width 466 and a channel height 468. The channel width 466 and channel height 468 define a channel area that is analogous to the mesh size or pore size of a Faraday cage. Increasing the channel area increases airflow and thermal management capacity. Decreasing the channel area increases EM attenuation and EM shielding capacity.

While shown oriented orthogonally to one another, the fins 456 and rails 458 may be oriented at any angle relative to one another. Additionally, the rails 458 and/or fins 456 may be non-planar. For example, the channels 464 may have non-rectangular cross-sectional shapes. In some implementations, the channels 464 may have a cross-sectional shape including any of a rectangle, triangle, parallelogram, hexagon, pentagon, octagon, other regular polygon, irregular polygon, combinations of tessellated polygons, curved shapes, irregular shapes, or combinations thereof. For example, some channels 464 may be octagonal with diamond-shaped channels 464 positioned therebetween.

In some implementations, all of the channels 464 have the same shape and equal cross-sectional area. For example, the channels 464 of a fin pack 426 may be uniform in cross-section. In other implementations, all of the channels 464 have the same shape while some have different cross-sectional areas. For example, the channels 464 may all have square cross-sections, but the squares may be different areas. In yet other implementations, the channels 464 have different shapes but the same cross-sectional area. For example, a semi-regular tessellated pattern of polygons may have equal areas despite being different shapes.

In at least one implementation, an integrated EM shielding fin pack has been tested to demonstrate increases in both thermal management performance, as well as EM attenuation performance. The comparison was conducted between a baseline conventional stacked combination and an integrated EM shielding fin pack of similar exterior dimensions to fit in the same application. For example, in the test, the EM shielding enclosure of the electronic device was 215 mm by 126 mm by 8.6 mm (in the x-, y-, and z-directions, respectively), and the EM shielding enclosure was made of aluminum. One eight-layer printed circuit board (PCB), having dimensions of 109 mm by 90.5 mm by 0.85 mm, was located inside of the enclosure. The thermal conductivity of the PCB is 40.1 W/mK in plane, and 0.46 W/mK through plane. One processor (heat source), with dimensions of 15 mm by 12.4 mm by 2.17 mm, was mounted on top of the PCB. This processor generated 20 W continuous power. One heat pipe, having dimensions of 127.4 mm by 12.4 mm by 1 mm, connects the chip to the fin packs. One 67 mm by 64 mm by 3.8 mm blower is mounted adjacent to the fin pack to provide airflow at 35 dBA.

The baseline conventional combination of a fin pack and an RF buffer was tested first. The RF buffer had 2 mm diameter holes to allow air flow therethrough while attenuating the EM interference produced by the processor. The 2 mm diameter holes provided 60% opening area through the RF buffer. The conventional fin pack has dimensions of 63.7 mm by 14.4 mm by 2.7 mm, and a fin thickness and fin spacing of 0.1 mm and 1.0 mm, respectively.

The implementation of an integrated EM shielding fin pack had an increase in depth from the 14.4 mm of the conventional fin pack to 16.5 mm, which was possible by removing the separate RF buffer and integrating it into the single integrated EM shielding fin pack. The fin spacing also decreased from 1.0 mm to 0.9 mm. Without the RF buffer, the air flow through the integrated EM shielding fin pack is greater than the airflow through the conventional combination, allowing for a narrower pitch, which reduces airflow, but improves RF attenuation.

The tested implementation was compared against a combination of a conventional independent RF buffer and a conventional independent fin pack. The integrated fin pack increased the flow rate of airflow as measured in cubic feet per minute (CFM), resulting in a reduced processing chip temperature and a reduced temperature within the surrounding EM shield, also known as the "bucket temperature." The results of the comparison are shown below in Table 1. The integrated fin pack allows for the removal of the independent RF buffer, increasing air flow through the fin pack and thermal energy transfer from the heat pipe, to lower the processor temperature by approximately 5%. Similarly, the ambient temperature within the EM shield of the computing device (such as the EM shield 130 of FIG. 2) by 1.4° Celsius.

TABLE 1

|  | Airflow (CFM) | Chip temperature (C.) | Bucket temperature (C.) |
| --- | --- | --- | --- |
| Baseline | 1.22 | 74 | 39.1 |
| RF-fin pack design | 1.39 | 71 | 37.7 |

Figure 6:
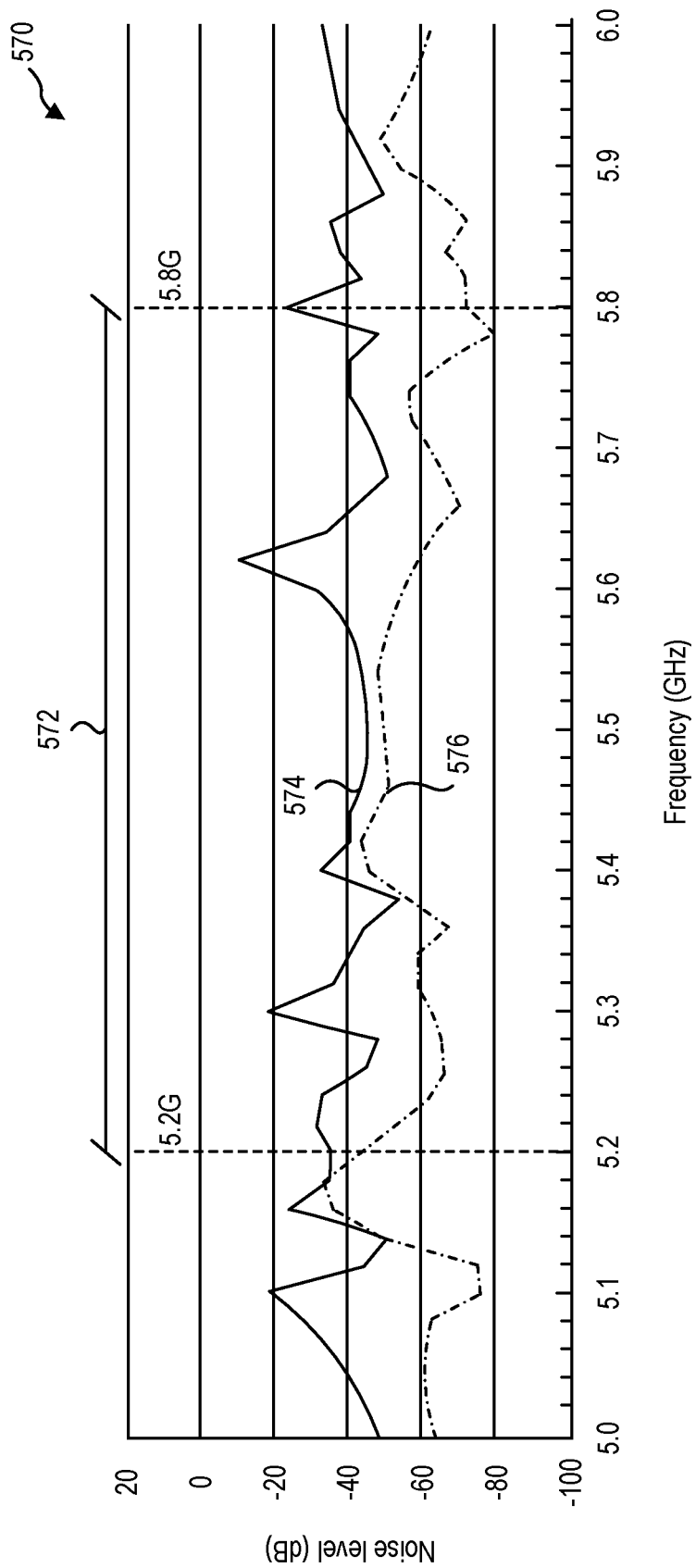
FIG. 6 is a chart illustrating the EM attenuation of an integrated EM shielding fin pack, according to at least one implementation of the present disclosure.

FIG. 6 illustrates a chart 570 that illustrates the change in EM attenuation of the integrated fin pack compared to the EM attenuation of the conventional RF buffer and conventional fin pack combination. The chart 570 shown the attenuation of EM radiation in an attenuation range 572 of the comparison. The upper curve is the conventional attenuation curve 574 of a stacked combination of the conventional RF buffer and the conventional fin pack. The conventional system shows an average of a 30 decibel (dB) attenuation over the attenuation range of 5.2 gigahertz (GHz) to 5.6 GHz.

The lower curve is the integrated attenuation curve 576 of the integrated EM shielding fin pack. The integrate attenuation curve 576 has an average attenuation of approximately 55 dB in the attenuation range 572. The attenuation improved, therefore, with the integrated fin pack (a lower noise level being associated with a greater attenuation) relative to the baseline conventional combination.

In other implementations, an integrated fin pack attenuates EM radiation in an attenuation range of 2.2 GHz to 2.6 GHz. In yet other implementations, an integrated fin pack attenuates EM radiation in an attenuation range of 800 MHz to 900 MHz. In further implementations, an integrated fin pack attenuates EM radiation in an attenuation range of 1.8 GHz to 2.0 GHz.

In some implementations, the integrated fin pack attenuates EM radiation in the attenuation range by at least 20 dB throughout the attenuation range. In other implementations, the integrated fin pack attenuates EM radiation in the attenuation range by at least 30 dB throughout the attenuation range. In yet other implementations, the integrated fin pack attenuates EM radiation in the attenuation range by at least 40 dB throughout the attenuation range.

In some implementations, the integrated fin pack attenuates EM radiation in the attenuation range by an average of at least 20 dB across the attenuation range. In other implementations, the integrated fin pack attenuates EM radiation in the attenuation range by an average of at least 30 dB across the attenuation range. In yet other implementations, the integrated fin pack attenuates EM radiation in the attenuation range by an average of at least 40 dB across the attenuation range.

One or more specific implementations of the present disclosure are described herein. These described implementations are examples of the presently disclosed techniques. Additionally, in an effort to provide a concise description of these implementations, not all features of an actual implementation may be described in the specification. It should be appreciated that in the development of any such actual implementation, as in any engineering or design project, numerous implementation-specific decisions will be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one implementation" or "an implementation" of the present disclosure are not intended to be interpreted as excluding the existence of additional implementations that also incorporate the recited features. For example, any element described in relation to an implementation herein may be combinable with any element of any other implementation described herein. Numbers, percentages, ratios, or other values stated herein are intended to include that value, and also other values that are "about" or "approximately" the stated value, as would be appreciated by one of ordinary skill in the art encompassed by implementations of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to implementations disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the implementations that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described implementations are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A computing device, comprising:
   a housing;
   a heat source located inside an electromagnetic shield, wherein the electromagnetic shield has an aperture;
   one or more electromagnetic radiation emitting electronic components within the housing but outside the electromagnetic shield;
   a fin pack located in the electromagnetic shield aperture, the fin pack providing fluid communication through the fin pack from a shielded side to an unshielded side of the electromagnetic shield; and
   a heat transfer element located between the heat source and the fin pack.

2. The computing device of claim 1, the electromagnetic shield defining a shielded side and an unshielded side with the aperture therethrough from the shielded side to the unshielded side.

3. The computing device of claim 1, the fin pack attenuating electromagnetic radiation in an attenuation range by at least 30 decibels.

4. The computing device of claim 3, the attenuation range being between 2.2 Gigahertz (GHz) and 2.6 GHz.

5. The computing device of claim 3, the attenuation range being between 1.8 GHz and 2.0 GHz.

6. The computing device of claim 3, the attenuation range being between 800 Megahertz (MHz) and 900 MHz.

7. The computing device of claim 1, the aperture having an area of at least 2 square centimeters ($cm^2$).

8. The computing device of claim 1, the heat transfer element configured to transfer heat from a processor toward the aperture.

9. The computing device of claim 1, the fin pack having at least one channel therethrough, the channel providing fluid communication through the fin pack from a first side to an opposite second side.

10. The computing device of claim 1, the fin pack having a thermal conductivity of at least 100 Watts per meter-Kelvin (W/m·K).

11. The computing device of claim 1, the fins having at least one rail connected thereto, the rail being positioned to contact more at least two of the fins.

12. The computing device of claim 1, wherein
the fin pack includes an upper and lower surface, the fin pack having a pack length, pack height, and pack width and having fins are oriented to connect the upper surface to the lower surface;
a plurality of channels extending from a first end toward a second end;
a first channel of the plurality of channels being adjacent the upper surface;
a second channel of the plurality of channels being adjacent the lower surface; and
at least one rail dividing the first channel and the second channel, the at least one rail positioned between the upper surface and the lower surface.

13. The computing device of claim 12, the first channel and second channel having equal cross-sectional areas.

14. The computing device of claim 12, at least one of the plurality of channels being rectangular.

15. The computing device of claim 12, the at least one rail providing electrical communication between a first fin of the fin pack and a second fin of the fin pack.

16. The computing device of claim 15, the at least one rail being positioned between the first channel and the second channel.

17. The computing device of claim 15, the at least one rail extending in a direction of the pack length for at least 25% of the pack length.

18. A computing device, comprising:
a housing;
an antenna;
a heat source;
a fin pack in thermal communication with the heat source, the fin pack adjacent the antenna without any added electromagnetic shielding between the fin pack and the antenna, the fin pack having at least one channel therethrough; and
an electromagnetic shield defining a shielded side and an unshielded side with an aperture therethrough from the shielded side to the unshielded side, the fin pack positioned in the aperture, wherein the antenna is positioned on the shielded side, the channel providing fluid communication through the fin pack from the shielded side to the unshielded side,
one or more electromagnetic radiation emitting electronic components within the housing but outside the electromagnetic shield;
the heat source including a heat transfer element configured to transfer heat from a processor toward the aperture.

19. The computing device of claim 18, wherein the fins have at least one rail connected thereto, the rail being positioned to contact more at least two of the fins.

20. A computing device, comprising:
an antenna;
a heat source;
a fin pack in thermal communication with the heat source, the fin pack adjacent the antenna, the fin pack having at least one channel therethrough, the fin pack attenuating electromagnetic radiation in an attenuation range by at least 30 decibels, the attenuation range being between 2.2 Gigahertz (GHz) and 2.6 GHz, the fins having at least one rail connected thereto, the rail being positioned to contact more at least two of the fins; and
an electromagnetic shield defining a shielded side and an unshielded side with an aperture therethrough from the shielded side to the unshielded side, the fin pack positioned in the aperture, the aperture having an area of at least 2 square centimeters ($cm^2$), wherein the antenna is positioned on the shielded side, the channel providing fluid communication through the fin pack from the shielded side to the unshielded side,
the heat source including a heat transfer element configured to transfer heat from a processor toward the aperture.

* * * * *